United States Patent
Lee et al.

(10) Patent No.: US 6,529,413 B2
(45) Date of Patent: Mar. 4, 2003

(54) METHOD FOR PREVENTING OVER-ERASING OF MEMORY CELLS AND FLASH MEMORY DEVICE USING THE SAME

(75) Inventors: June Lee, Seoul (KR); Young-Ho Lim, Kyunggi-do (KR)

(73) Assignee: Samsung Electronics Co., Ltd., Hwasung (KR)

(*) Notice: Subject to any disclaimer, the term of this patent is extended or adjusted under 35 U.S.C. 154(b) by 0 days.

(21) Appl. No.: 09/952,807

(22) Filed: Sep. 13, 2001

(65) Prior Publication Data

US 2002/0080653 A1 Jun. 27, 2002

(30) Foreign Application Priority Data

Oct. 26, 2000 (KR) ........................................ 2000-63184

(51) Int. Cl.[7] .............................................. G11C 16/06
(52) U.S. Cl. .......................... 365/185.22; 365/185.18; 365/185.29
(58) Field of Search ...................... 365/185.29, 185.22, 365/185.3, 185.18, 185.01, 185.33, 218

(56) References Cited

U.S. PATENT DOCUMENTS

| | | | | | |
|---|---|---|---|---|---|
| 5,214,605 | A | * | 5/1993 | Lim et al. | 365/185.22 |
| 5,287,317 | A | * | 2/1994 | Kobayashi et al. | 365/218 |
| 5,917,755 | A | * | 6/1999 | Rinerson et al. | 365/185.29 |
| 6,314,027 | B1 | * | 11/2001 | Choi | 365/185.29 |

* cited by examiner

*Primary Examiner*—Huan Hoang
*Assistant Examiner*—Gene N. Auduong
(74) *Attorney, Agent, or Firm*—Marger Johnson & McCollom, P.C.

(57) ABSTRACT

Disclosed herein is an erase method of a flash memory device that comprises discrete first and second erase discrimination periods. An erase operation is carried out using a bulk stepping scheme during the first erase discrimination period while the erase operation is carried out using a fixed bulk voltage during the second erase discrimination period. According to this method, the number of over-erased memory cells caused by the bad erase property is reduced, so that a total erase time of the flash memory device can be reduced and over-erase can be prevented.

9 Claims, 8 Drawing Sheets

(a)

(b)

METHOD FOR PREVENTING OVER-ERASING OF MEMORY CELLS AND FLASH MEMORY DEVICE USING THE SAME

This application relies for priority on Korean Patent Application No. 2000-63184, filed on Oct. 26, 2000, the contents of which are herein incorporated by reference in their entirety.

FIELD OF THE INVENTION

The present invention relates to nonvolatile storage devices, and, in particular, to a flash memory device with an improved program algorithm capable of reducing program time.

BACKGROUND OF THE INVENTION

Generally, semiconductor memory devices for storing data are classified into volatile semiconductor memory devices and nonvolatile semiconductor memory devices. The volatile semiconductor memory devices lose their data at power-off, and the nonvolatile semiconductor memory devices maintain their data even at power-off. Therefore, the nonvolatile semiconductor memory devices have been widely used at applications in which power can be unexpectedly interrupted.

The nonvolatile semiconductor memory devices comprise electrically erasable and programmable ROM cells which are referred to as "flash EEPROM cells" or "flash memory cells." FIG. 1 shows a cross-sectional view of the flash memory cell. The flash memory cell, as illustrated in FIG. 1, has a semiconductor substrate (or bulk) 1 of a first conductive type (e.g., P type), source and drain regions 2 and 3 of a second conductive type (e.g., N type) spaced apart relative to each other, a floating gate 6 storing charges and placed over a channel region between the source and drain regions 2 and 3, with a thin insulation film 4 having a thickness of about 100 Å interposed therebetween, and a control gate 8 placed over the floating gate 6, with another insulation film 7 interposed therebetween. The control gate 8 is connected to a word line.

The table below shows typical source, drain, control gate and bulk voltages according to program, read, erase and erase repair operations of a flash memory cell.

TABLE

|    | Read   | Program | Erase    | Erase repair |
|----|--------|---------|----------|--------------|
| Vg | 14.5 V | 10 V    | −10 V    | ~2 V         |
| Vd | 1 V    | 5 V~6 V | Floating | 5 V~6 V      |
| Vs | 0 V    | 0 V     | Floating | 0 V          |
| Vb | 0 V    | 0 V     | 5 V~10 V | 0 V          |

The program operation of the flash memory cell is performed by biasing a substrate 1 and a source region 2 with a ground voltage and the drain region 3 with a positive voltage (e.g., 5 V~6 V) appropriate to generate hot electrons. According to this program operation, a sufficient amount of charges are stored in the floating gate 6, thus the floating gate 8 has a negative voltage. This means that a threshold voltage of the programmed flash memory cell is increased when performing the read operation.

During the read operation where a positive voltage (e.g., 4.5 V) is applied to the control gate 8 and the ground voltage is applied to the source region 3, no channel of the programmed memory cell is formed. That is, current from the drain region 3 to the source region through the channel is cut off. At this time, the memory cell has an "off" state, and a threshold voltage thereof is distributed in a range of 6 V to 7 V, as illustrated in FIG. 2.

Flash memory cells in a sector are simultaneously erased by a F-N (Flower-Nordheim) tunneling mechanism. According to the F-N tunneling mechanism, a negative high voltage (e.g., −10 V) is applied to the control gate 9 and a positive voltage (e.g., 5 V to 10 V) is applied to the semiconductor substrate 1. At this time, as seen from the table, the source and drain regions 2 and 3 are maintained at a floating state of high-impedance. An erase operation of this bias condition is named a "Negative Gate and Bulk Erase (NGBE)" operation. By such a bias condition, an electric field of about 6~7 millivolts (mV)/cm is formed across the tunneling oxide film 4 or between the control gate 8 and the semiconductor substrate 1, and negative charges accumulated in the floating gate 6 are emitted via the tunneling oxide layer 4 to the semiconductor substrate 2 via a mechanism such as the F-N tunneling. This causes the effective threshold voltage of the cell to be reduced to within a range of about 1 V to 3 V. As its effective threshold voltage is reduced, the cell transistor enters a conductive state (i.e., an "on" state) when a read voltage is applied to the control gate 8 during the read operation.

Various erase methods associated with the flash memory device are disclosed in U.S. Pat. No. 5,781,477 entitled "FLASH MEMORY SYSTEM HAVING FAST ERASE OPERATION", U.S. Pat. No. 5,132,935 entitled "ERASURE OF EEPROM MEMORY ARRAYS TO PREVENT OVER-ERASED CELLS", U.S. Pat. No. 5,220,533 entitled "METHOD AND APPARATUS FOR PREVENTING OVERERASURE IN A FLASH CELL", U.S. Pat. No. 5,513,193 entitled "NON-VOLATILE SEMICONDUCTOR MEMORY DEVICE CAPABLE OF CHECKING THE THRESHOLD VALUE OF MEMORY CELLS", and U.S. Pat. No. 5,805,501 entitled "FLASH MEMORY DEVICE WITH MULTIPLE CHECKPOINT ERASE SUSPEND LOGIC".

The erase verify operation determines whether all memory cells in a sector after the NGBE operation exist in a target threshold voltage range (e.g., 1 V~3 V) corresponding to the on state. The erase verify operation is performed by biasing the control gate with an erase verify voltage of about 3 V and the drain region with a voltage of about 5 V. At this time, the source region and the semiconductor substrate are grounded.

Commonly, a threshold voltage of the erased flash memory cell is distributed in a range of 1 V to 3 V. Nevertheless when all memory cells of the sector are simultaneously erased, a threshold voltage of a flash memory cell may be lowered below 1 V. Such a flash memory cell is named "an over-erased memory cell". The over-erased memory cell(s) can be repaired by an erase repair operation (referred to as a post program operation or an over-erase repair operation), in which the threshold voltage of the over-erased cell is shifted in a target threshold voltage range (e.g., 1 V~3 V) corresponding to the on state.

The erase repair operation is performed by biasing the source region and the semiconductor substrate of the over-erased memory cell with the ground voltage and the control gate thereof with a voltage of about 3 V. Under this bias condition, negative charges less than that of the program operation are accumulated in the floating gate. Thus, by performing the erase repair operation, the threshold voltage of the over-erased flash memory cell can be shifted in the target threshold voltage range of the on state as illustrated in FIG. 2.

In general, memory cells of the sector are erased according to a set of algorithms including a pre-program algorithm, a main erase algorithm and a post-program algorithm. The pre-program algorithm corresponds to the above-mentioned program process, and the post-program algorithm corresponds to the above-mentioned erase repair process. The main erase algorithm corresponds to the above-mentioned erase process. A flowchart illustrating a main erase algorithm according to the prior art is illustrated in FIG. 3.

In order to perform a sector (or block) erase operation, first, an address counter, an erase loop counter and a bulk step counter are initialized (S10). The address counter generates an address for appointing memory cells to be selected by the byte or word, the erase loop counter is used to limit loop times consisting of a set of NGBE and erase verify operations, and the bulk step counter is used to step a bulk voltage. After initializing, the NGBE and erase verify operations are performed in a subsequent step S20. The NGBE operation to a selected sector is performed during a predetermined period of time (e.g., 2~5 seconds) according to the above-mentioned bias condition.

After the NGBE operation, the erase verify operation is carried out which is to judge whether the threshold voltages of the erased memory cells are distributed below an upper limit value (e.g., 3 V) of a threshold voltage distribution corresponding to the on or erased state. Such an erase verify operation is identical to a read operation with the exception of a voltage applied to the control gate. If data bits of a byte or word unit read out according to the erase verify operation all are a logic "1", then the erase verify operation is treated as a verify pass indicating that the threshold voltages of the selected memory cells exist in the threshold voltage distribution corresponding to the erased state. If at least one data bit is a logic "0", the erase verify operation is treated as verify fail. In this case, the erase operation is again performed.

Before the erase operation is again carried out, it is determined whether a current erase loop value exceeds a maximum erase loop value (S40). If so, the main erase algorithm ends as erase fail. If not, the loop counter is increased by 1. To accelerate the NGBE operation, the bulk voltage is stepped by a predetermined voltage (e.g., 0.2 V~03. V) through step S50. The NGBE operation is carried out using the bulk voltage thus increased in the step S20. As the bulk voltage is increased, on the whole, a threshold voltage distribution of a memory cell is shifted left along an X-axis of FIG. 2 in proportion to an increased magnitude of the bulk voltage. The above-described steps S20 to S50 are repeated until the threshold voltages of all memory cells are shifted below the maximum limit value of the threshold voltage distribution corresponding to the erased state.

According to the main erase algorithm of the prior art using the bulk voltage stepping method, in case the NGBE operation is carried out successfully, all memory cells have a threshold voltage distributed below the maximum limit value of the threshold voltage distribution corresponding to the erased state. In case several memory cells with bad erase property or slow erase speed exist in a sector to be erased, the main erase algorithm of the prior art has the following problem.

In order to shift threshold voltages of memory cells with the bad erase property in the threshold voltage distribution of the erased state, as described above, the bulk voltage is increased and then a next NGBE operation is performed using the increased bulk voltage. However, threshold voltages of memory cells, which exist in the threshold voltage distribution of the erased state, are shifted left increasingly in proportion to the increased magnitude of the bulk voltage. As a result, threshold voltages of memory cells placed near or at a minimum limit value are shifted below the minimum limit value of the threshold voltage distribution corresponding to the erased state. That is, the number of over-erased memory cells is increased. This causes an undesirable increase in the time necessary for the post-program algorithm to be performed after the main erase algorithm. In other words, the time for an overall erase operation is increased.

SUMMARY OF THE INVENTION

It is therefore an object of the invention to provide a flash memory device and an erase method thereof that are capable of reducing overall erase time.

It is another object of the invention to provide a flash memory device and an erase method thereof that can minimize over-erasing of flash memory cells during an erase operation.

In order to attain the above objects, according to an aspect of the present invention, there is provided a novel erase method for erasing an array of memory cells, arranged in rows and columns, through a set of erase and erase verify operations. This method includes the first step of performing the erase operation according to a gradually increased bulk voltage during a first erase discrimination period in which a representing number of failed erase verify cells is higher than a first predetermined value; and the second step of performing the erase operation according to a fixed bulk voltage during a second erase discrimination period in which the so-called 'fail number' of the erase verify operation is between the first predetermined value and a second predetermined value.

In this embodiment, the first step comprises the steps of repeatedly performing an erase verify operation on ones of the memory cells after simultaneously erasing the memory cells according to a predetermined bulk voltage; generating a pass/fail signal indicating that the erase verify operation has failed; and increasing the bulk voltage when a determined number of the pass/fail signals is higher than the first predetermined value and performing the erase operation on the array.

In this embodiment, the second step comprises the steps of repeatedly performing an erase verify operation on ones of the memory cells after simultaneously erasing the memory cells according to the fixed bulk voltage; generating a pass/fail signal indicating that the erase verify operation has failed; and performing the erase operation on the array according to the fixed bulk voltage when a determined number of the pass/fail signals is higher than the second predetermined value.

In this embodiment, the second value is less than the first value and is zero or a positive integer.

BRIEF DESCRIPTION OF THE DRAWINGS

A more complete appreciation of the present invention, and many of the attendant advantages thereof, will become readily apparent as the same becomes better understood by reference to the following detailed description when considered in conjuction with the accompanying drawings in which like reference symbols indicate the same or similar components, wherein.

DESCRIPTION OF THE PREFERRED EMBODIMENT

The preferred embodiment of the invention will be more fully understood with reference to the attached drawings.

Figure 1:
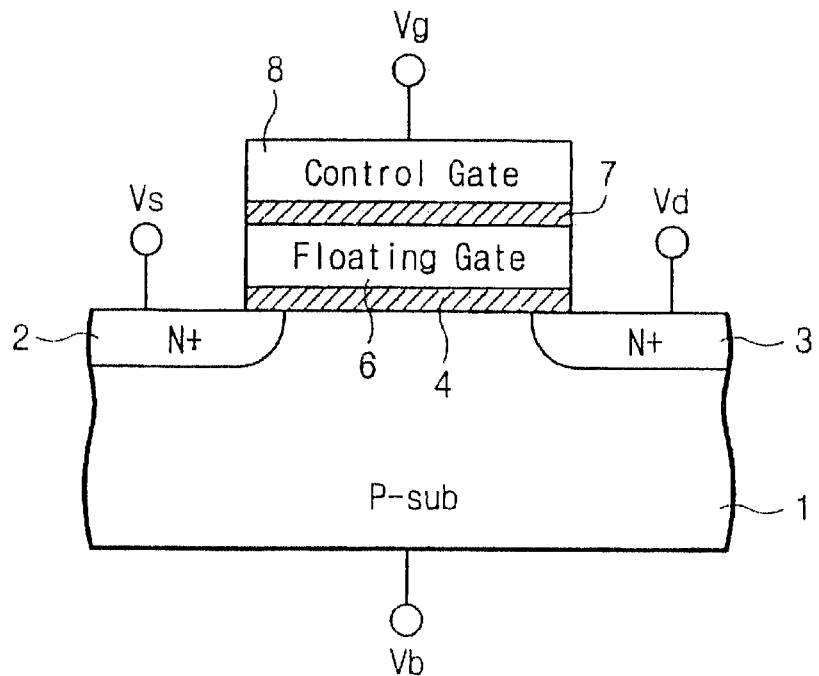
FIG. 1 is a cross-sectional view of a conventional flash memory cell.
Figure 2:
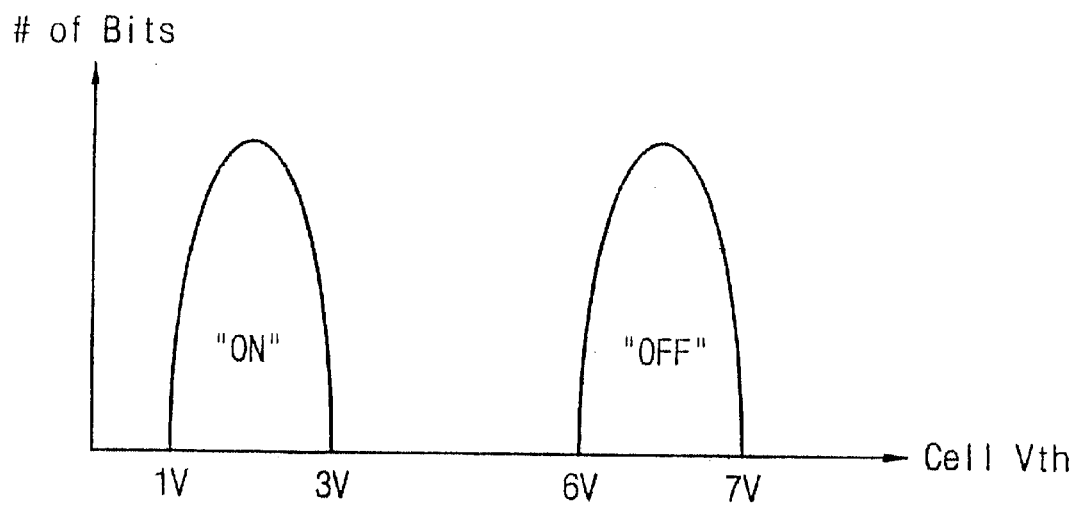
FIG. 2 is a diagram showing threshold voltage distributions of on and off cells in a conventional cell.
Figure 3:
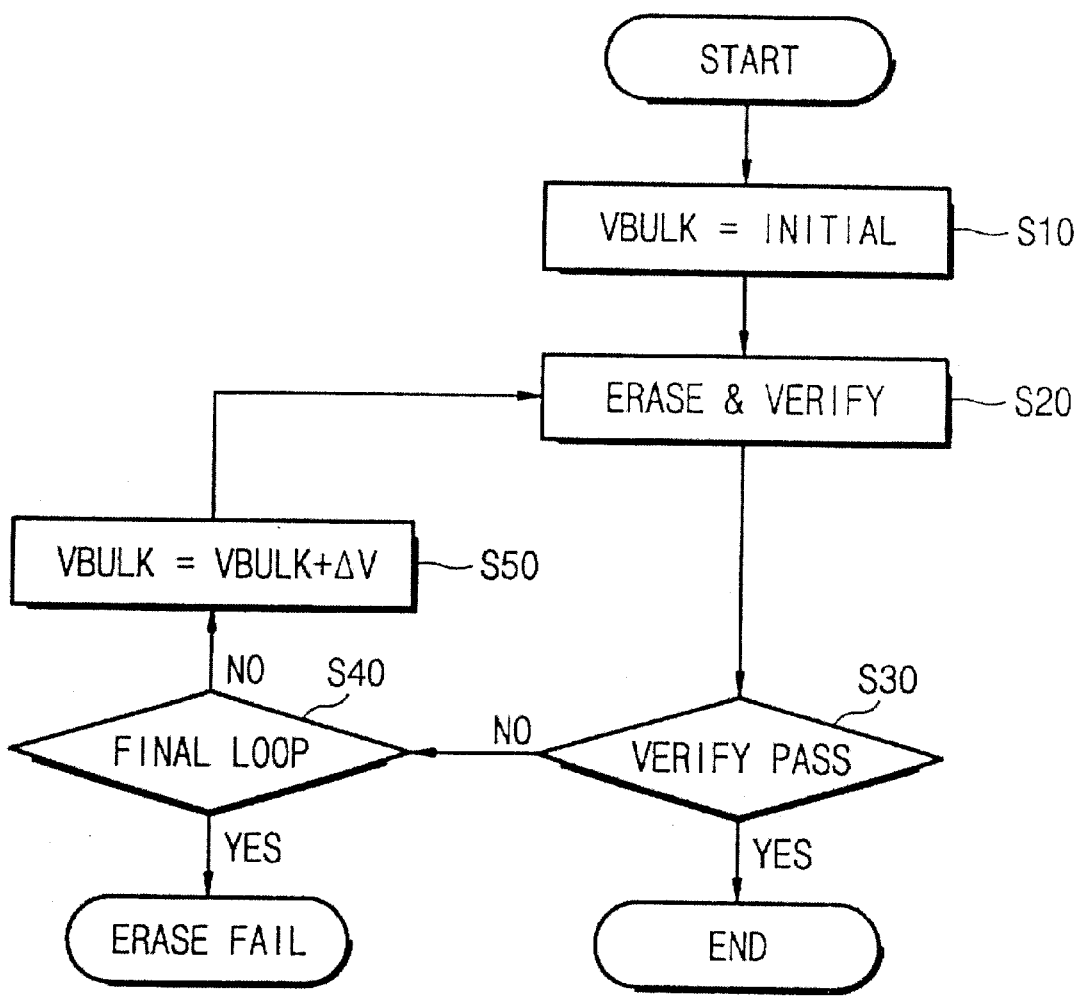
FIG. 3 is a flowchart illustrating an erase method according convention.
Figure 4:
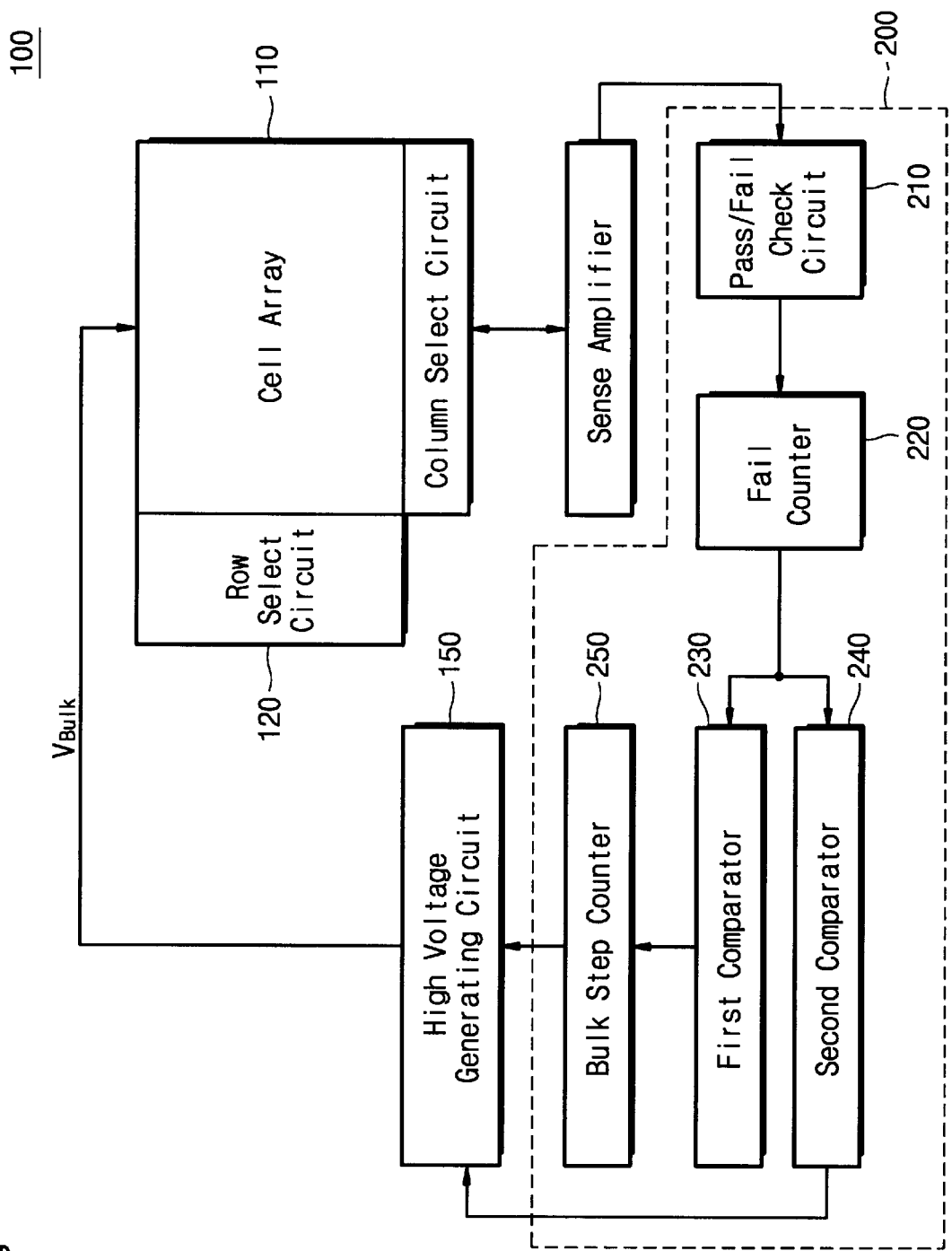
FIG. 4 is a block diagram showing a flash memory device according to the present invention.

Referring to FIG. 4, a block diagram showing a flash memory device according to the present invention is illustrated. The flash memory device 100 comprises an array 110 of flash memory cells having the same structure as illustrated in FIG. 1. Although not illustrated in a figure, it is understood that a plurality of word lines extending along rows and a plurality of bit lines extending along columns are provided to the array 110. The flash memory cells of the array 110 are erased at the same time. This means that the flash memory cells are formed on a single bulk or semiconductor substrate.

The array 110 in FIG. 4 corresponds to a sector or a block, and a NOR-type flash memory device having the array of a block or sector structure is disclosed in the IEEE International Solid State Circuits, pp 42 to 43, Feb. 8, 1996 under the title of "A 3.3 V—only 16 Mb Flash Memory with Row-Decoding Scheme", which is hereby incorporated by reference.

The NOR-type flash memory device of the disclosure comprises an array divided into a plurality of sectors or blocks. A bulk region of each sector is electrically isolated, and flash memory cells integrated on each sector are simultaneously erased during the above-described erase operation. Each sector forms an erase unit, and word lines and bit lines of each sector are selected separately from other sectors. This architecture enables program and erase operations to be performed without disturb and thus has high reliability.

Continuing to refer to FIG. 4, the flash memory device 100 further comprises a row select circuit 120, a column select circuit 130 and a sense amplifier circuit 140. The row select circuit 120 selects one of the word lines in response to a row address from an X-counter (or a row address counter) not illustrated in a figure. The row select circuit 120 supplies the selected word line with a word line voltage necessary for any operation such as a program, erase, read, erase verify or erase repair operation.

The column select circuit 130 selects a byte or word unit of ones of the bit lines in response to a column address from a Y-counter (or a column address counter) not shown in the figure. Similarly the column select circuit 130 supplies the selected bit lines with a drain voltage necessary for any operation such as a program, erase, read, erase verify or erase repair operation. The sense amplifier circuit 140 senses and amplifies on/off states of flash memory cells selected by the row and column select circuits 120 and 130.

In the flash memory device 100, an erase control circuit 200 is provided which controls an erase operation of flash memory cells arranged in the array 110. A control circuit 200 includes a pass/fail check circuit 210, a fail counter 220, first and second comparators 230 and 240 and a bulk step counter 250. The constituent elements of the erase control circuit 200 will be more fully described below. The flash memory device 100 further comprises a high voltage generating circuit 150, which generates a bulk voltage VBULK to be supplied to a bulk or a semiconductor substrate of the array 110 according to the control of the erase control circuit 200 during an erase operation.

Figure 5:
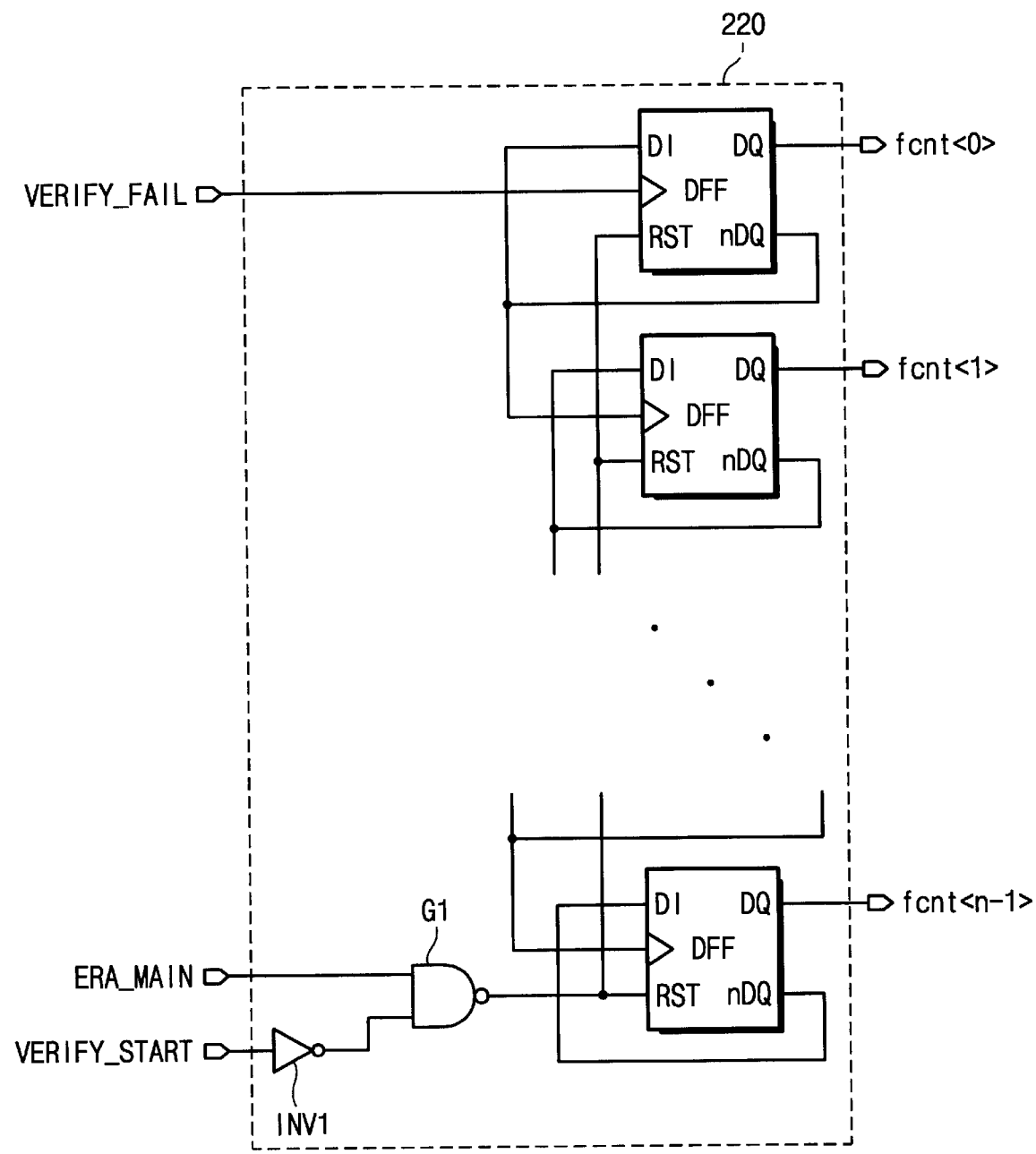
FIG. 5 is a preferred embodiment of a fail counter illustrated in FIG. 4.

FIG. 5 is a circuit diagram showing a preferred embodiment of the fail counter illustrated in FIG. 4.

Referring to FIG. 5, the fail counter 220 comprises a plurality of D flip-flops DFF, an inverter INV1 and a NAND gate G1 (which, as will be seen, performs an OR function) which are connected as illustrated in FIG. 5. Each of the D flip-flops DFF has one input terminal DI, a clock terminal, a reset terminal RST and two output terminals DQ and nDQ. A VERIFY_FAIL signal is a pulse signal output from the pass/fail check circuit 210 and is activated when at least one of the data bits input to the pass/fail check circuit 210 is a logical "1". An output value fcnt<0> to fcnt<n−1> of the fail counter 220 is increased or counted up by 1 whenever the pulse signal VERIFY_FAIL is activated. An ERA_MAIN signal is a flag signal indicating a main erase algorithm, and a VERIFY_START signal is activated high whenever an erase verify operation is performed after a NGBE operation. When the ERA_MAIN signal has a high-to-low transition, or when the VERIFY_START signal has a low-to-high transition, the fail counter 220 is initialized.

Figure 6:
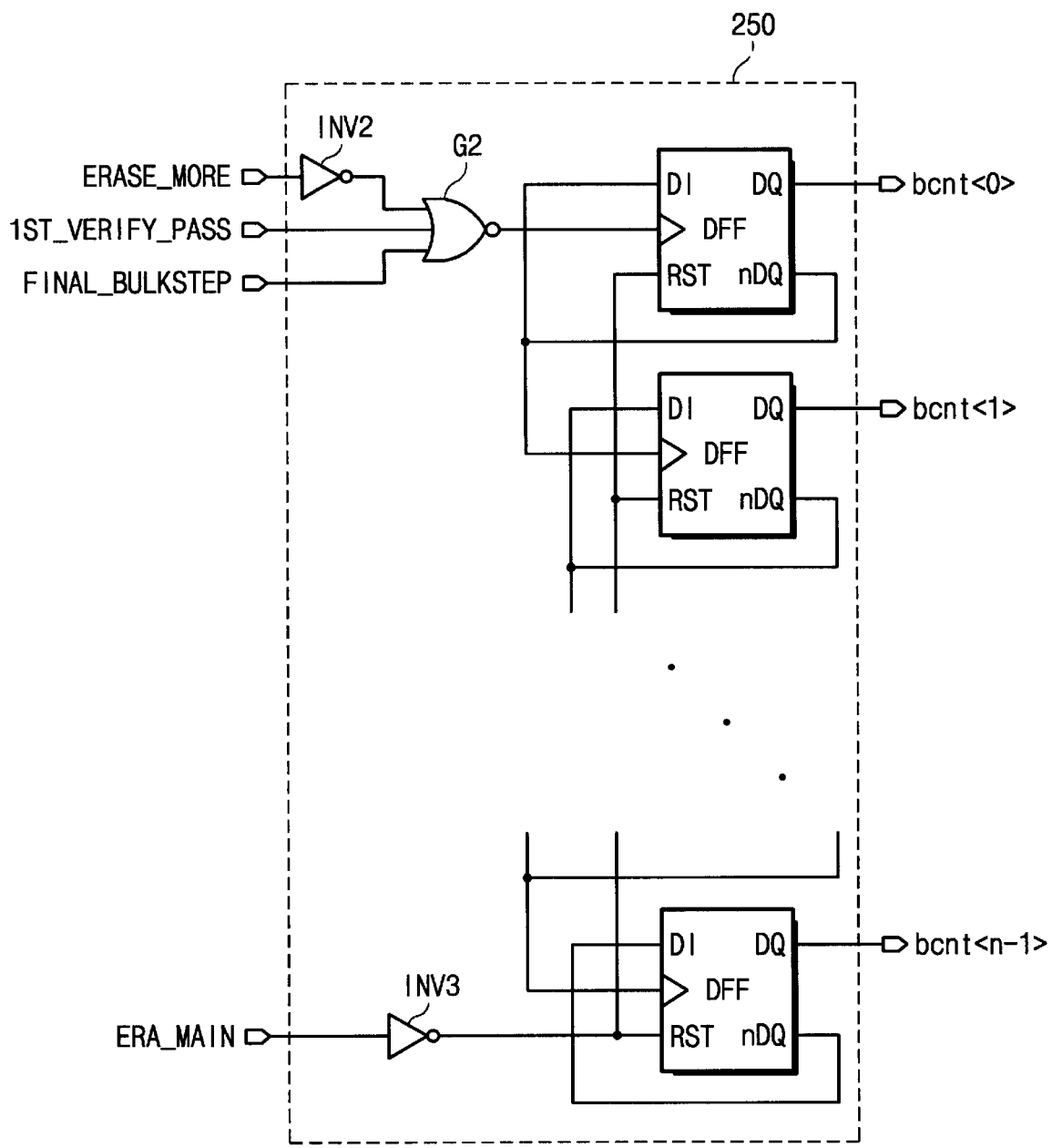
FIG. 6 is a preferred embodiment of a bulk step counter illustrated in FIG. 4.

FIG. 6 is a circuit diagram of a preferred embodiment of the bulk step counter illustrated in FIG. 4.

Referring to FIG. 6, the bulk step counter 250 has two inverters INV2 and INV3, a NOR gate G2 and a plurality of D flip-flops DFF, which are connected as illustrated in the figure. In FIG. 6, an ERASE_MORE signal is a pulse signal indicating that an erase verify operation is failed, and a 1ST_VERIFY_PASS signal is a signal indicating a first discrimination period (which will be more fully described below). In this embodiment, the 1ST_VERIFY_PASS signal is maintained low during the first discrimination period and high during a second discrimination period (which will be more fully described below). A FINAL_BULKSTEP signal is a signal indicating that a bulk voltage is increased up to a maximum value.

While the 1ST_VERIFY_PASS signal is maintained low or during the first discrimination period, an output value bcnt<0> to bcnt<n−1> of the bulk step counter is counted up whenever the ERASE_MORE signal is activated. In case the FINAL_BULKSTEP signal is activated high or the 1ST_VERIFY_PASS signal is activated high, even if the ERASE_MORE signal is activated, the output of the bulk step counter 250 is not counted up. The D flip-flops DFF are reset by the flag signal ERASE_MAIN indicating the main erase operation.

Figure 7:
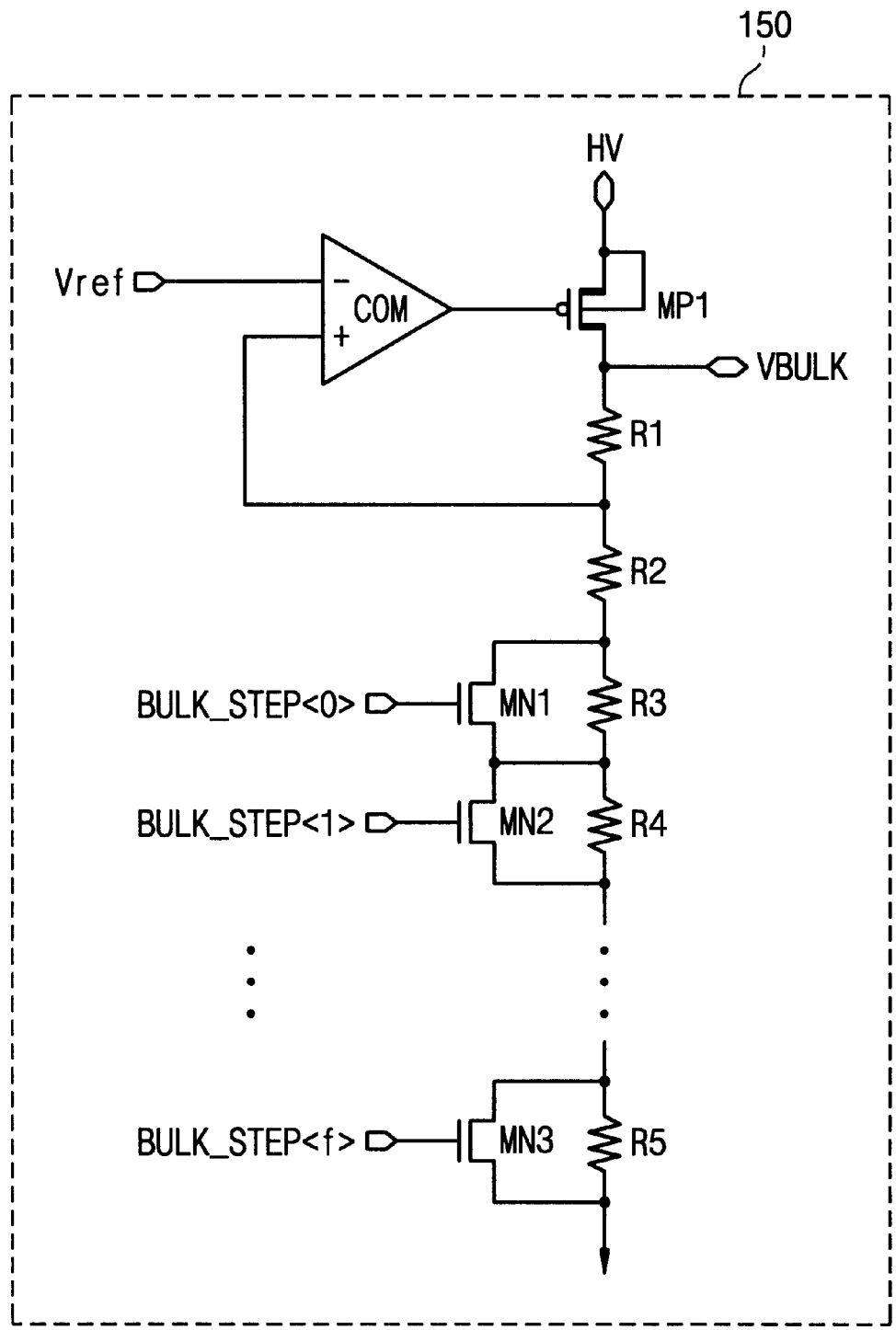
FIG. 7 is a preferred embodiment of a high voltage generating circuit illustrated in FIG. 4.

FIG. 7 is a circuit diagram showing a preferred embodiment of the bulk voltage generating circuit illustrated in FIG. 4.

Referring to FIG. 7, the bulk voltage generating circuit 150 has a differential amplifier serving as a comparator COM, a PMOS transistor MP1 serving as a driver, NMOS transistors MN1, MN2 to MN3 and resistors R1, R2, R3, R4 to R5, wherein the NMOS transistors and the resistors serve as a voltage divider. In FIG. 7, input signals BULK_STEP<0> to BULK_STEP<f> are obtained by combining output signals bcnt<0> to bcnt<n-1> of the bulk step counter 250. The bulk voltage generating circuit 150 divides a voltage HV according to the input signal BULK_STEP<0> to BULK_STEP<f> and outputs the divided voltage as a bulk voltage VBULK. As shown in FIG. 7, the bulk voltage VBULK is sequentially increased according to combination of the input signals BULK_STEP<0> to BULK_STEP<f>.

Figure 8:
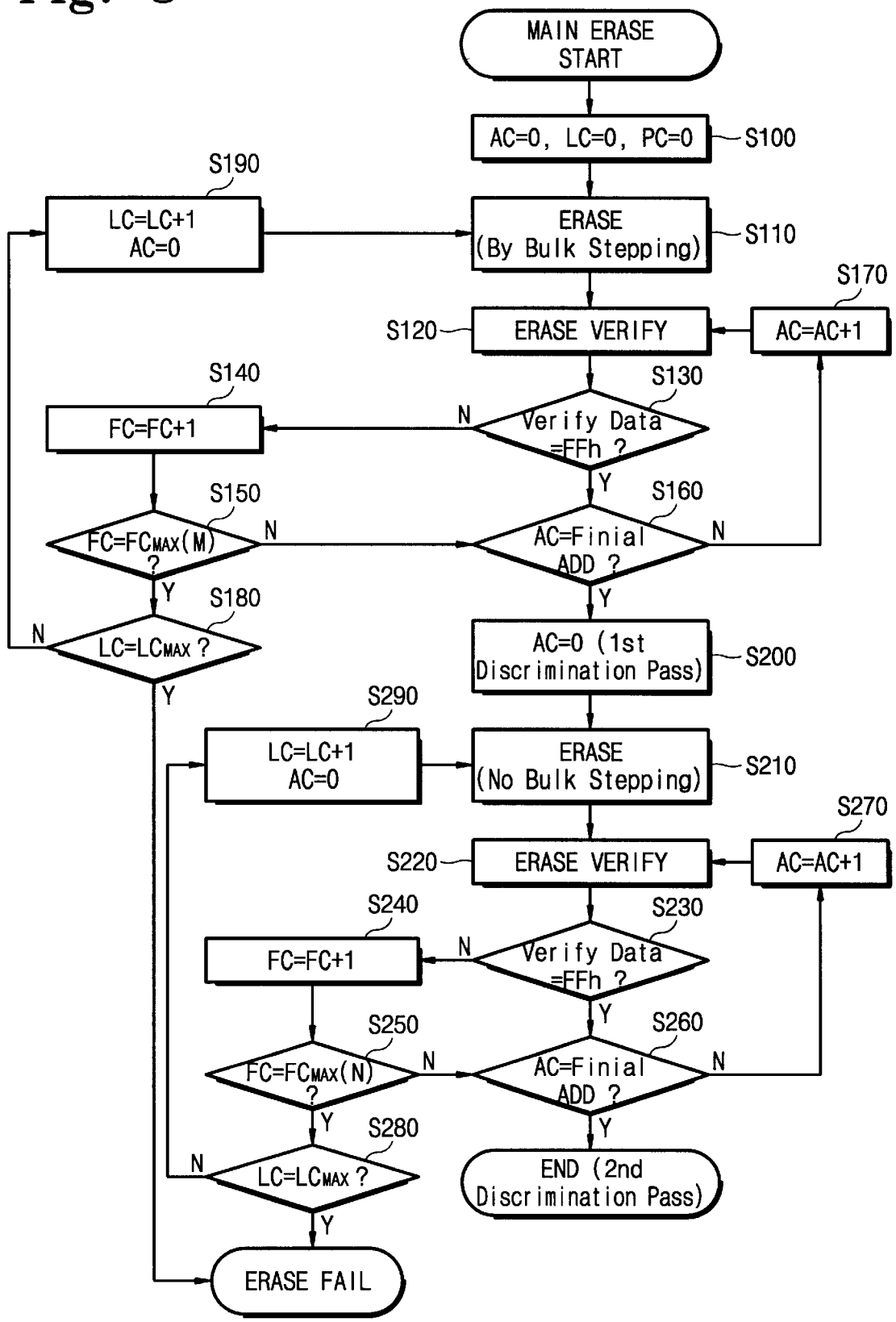
FIG. 8 is a flowchart describing a main erase algorithm according to the present invention.

FIG. 8 is a flowchart showing a main erase algorithm according to a preferred embodiment of the present invention. Below, the main erase operation according to the present invention will be more fully described with reference to the accompanying drawings.

First, if an erase operation starts, values AC, LC and FC of address, loop and fail counters are initialized in step S100. In a next step S100, a NGBE operation is performed under the same bias condition as described above. That is, a voltage of −10 V is applied to control gates of flash memory cells, i.e., all word lines arranged in the array 110, and a VBULK voltage of 5 V is applied to the bulk or the semiconductor substrate. After a time lapse under such a bias condition (Vg=−10 V and VBULK(Vb)=5 V), an erase verify operation is carried out under the bias condition such as Vg=3 V, Vd=5 V, Vs=0 V and Vb=0 V (S120). As above described, the erase verify operation determines whether flash memory cells of a sector are distributed in a target threshold voltage range (e.g., 1 V~3 V) corresponding to an on state (or an erased state). As is well known in the art, the erase verify operation is carried out in the same manner as a read operation with the exception of a bias condition.

Data bits Douti (i is an integer and is determined by a byte or word unit), which are read out by the sense amplifier circuit 140 according to the erase verify operation, are transferred to the pass/fail check circuit 210 of the erase control circuit 200. In step S130, the pass/fail check circuit 210 checks whether threshold voltages of the selected flash memory cells are equal to or less than a maximum limit value (e.g., 3 V) of the target threshold voltage range (1 V~3 V) corresponding to the erased state. That is, the pass/fail check circuit 210 determines whether all of the input data bits Douti are at a logical "1" (indicating a threshold voltage higher than the maximum limit value). If at least one of the input data bits Douti has a threshold voltage higher than the maximum limit value (e.g., 3 V), the pass/fail check circuit 210 generates or activates the pass/fail signal VERIFY_FAIL of a pulse form.

In a next step S140, a value FC of the fail counter 220 illustrated in FIG. 5 is counted up according to the pass/fail signal VERIFY_FAIL. The procedure goes to step S150, in which it is determined (or decided) whether the value FC of the fail counter 220 is identical to a predetermined value M. In other words, the first comparator 230 of the erase control circuit 200 compares the value FC of the fail counter 220 with the predetermined value M. If the fail counter value FC is less than the predetermined value M, the procedure goes to step S160. Herein the fail counter value FC indicates the number of performed erase verify operations. In the step S160, it is determined (or decided) whether a value AC of the address counter is a final address. When the address counter value AC is not the final address, the address counter value AC is increased by 1 through step S170 and the erase verify operation is performed in the step S120. The steps S120 to S170 are repeated until the fail counter value is identical to the predetermined value M or until the address counter value AC is identical to the final address.

As a decisional result of the step S150, in case the fail counter value FC is identical to the predetermined value M, a value of the bulk step counter 250 is increased by 1 according to an output of the first comparator 230, so that the bulk voltage VBULK is stepped by a predetermined value. Then it is determined whether a value LC of the loop counter reaches a maximum loop value LCmax (S180). If the loop counter value LC is more than the maximum loop value, the main erase operation is ended as erase fail. If the loop counter value LC is less than the maximum loop value LCmax, then the procedure continues at step S190, in which the loop counter value LC is increased by 1 and the address counter value AC is set to 0. Then, the NGBE operation is performed using the increased bulk voltage VBULK. After this, the erase verify operation will be carried out in the same manner as above described. Herein the fail counter 220 is initialized by the flag signal VERIFY_START indicating start of the erase verify operation after the NGBE operation.

In this embodiment, the period where the above-described steps S110 to S190 are performed is referred to as "a first erase discrimination period".

As the decisional result of step S160, if the address counter value AC is identical to the final address, that is, if the first erase discrimination operation is passed, the procedure continues at step S200, in which the address counter value AC is initialized. Then a NGBE operation is performed at step S210. At this time, the bulk voltage VBULK has a fixed voltage. For example, a bulk voltage used at a previous NGBE operation or at a final NGBE operation of the first erase discrimination period is utilized in the step S210. After the NGBE operation using the fixed bulk voltage, in step S220, an erase verify operation is carried out in the same manner as described above.

Data bits Douti read out by the sense amplifier circuit 140 according to the erase verify operation are transferred to the pass/fail check circuit 210 of the erase control circuit 200. In step S230, the pass/fail check circuit 210 determines whether threshold voltages of the selected flash memory cells are identical to or less than a maximum limit value (e.g., 3 V) of the target threshold voltage range (1 V~3 V) corresponding to the erased state. That is, the pass/fail check circuit 210 decides whether all of the input data bits Douti are at a logical "1". If at least one of the input data bits Douti has a threshold voltage higher than the maximum limit value (e.g., 3 V), the pass/fail check circuit 210 generates or activates the pass/fail signal VERIFY_FAIL of a pulse form.

In a next step S240, a value FC of the fail counter 220 illustrated in FIG. 5 is counted up according to the pass/fail signal VERIFY_FAIL. The procedure goes to step S250, in which it is determined (or decided) whether the value FC of the fail counter 220 is identical to a predetermined value N (N is an integer less than M). That is, the second comparator 240 of the erase control circuit 200 compares the value FC of the fail counter 220 with the predetermined value N. If the fail counter value FC is less than the predetermined value N, the procedure goes to step S260, in which it is determined whether a value AC of the address counter is a final address. When the address counter value AC is not the final address, the address counter value AC is increased by 1 through step S270 and the erase verify operation is performed at the step S220. The steps S220 to S270 are repeated until the fail counter value is identical to the predetermined value N or until the address counter value AC is identical to the final address.

As a decisional result of the step S250, in case the fail counter value FC is identical to the predetermined value N, it is determined whether a value LC of the loop counter reaches a maximum loop value LCmax (S280). If the loop counter value LC is more than the maximum loop value, the main erase operation is ended as erase fail. If the loop counter value LC is less than the maximum loop value LCmax, the procedure continues at step S290, in which the loop counter value LC is increased by 1 and the address counter value AC is set to 0. Then, at the step S210, the NGBE operation is performed using the fixed bulk voltage VBULK. After this, the erase verify operation will be carried out in the same manner as described above. Herein the fail counter 220 is initialized by the flag signal VERIFY_START indicating start of the erase verify operation after the NGBE operation. The period where the above-described steps S210 to S290 are performed is referred to as "a second erase discrimination period".

In this embodiment, note that a given value N of the second comparator 240 can be set to "0" or positive integer. If the given value N is 0, the erase verify operation is not circulated. On the other hand, if at least one of the data bits read according to the erase verify operation after the NGBE operation is 0, the NGBE operation may be directly carried out using the fixed bulk voltage, without steps S260 and S270.

Figure 9:
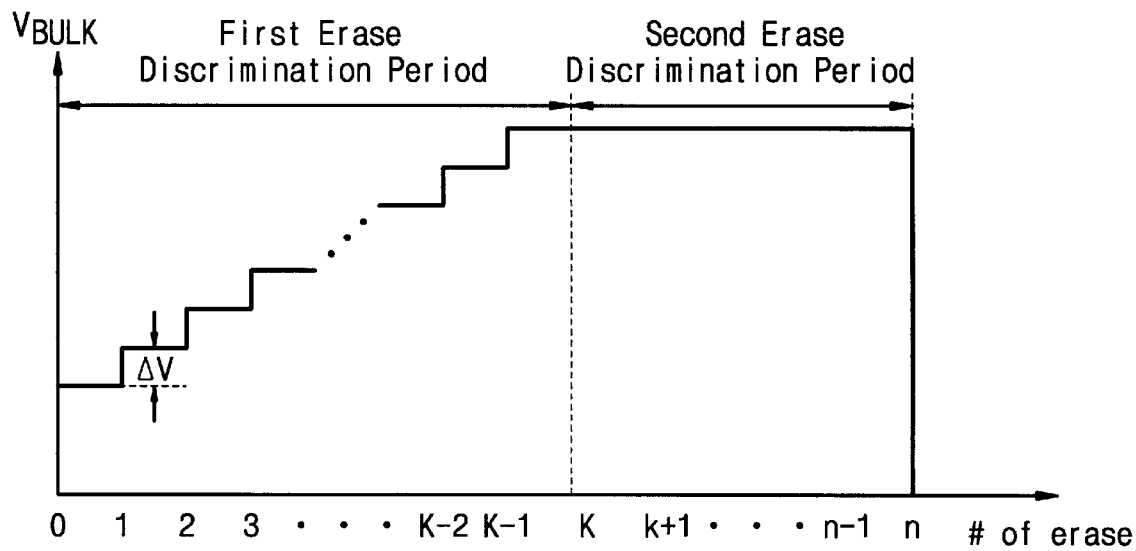
FIGS. 9A and 9B are diagrams for describing variations of a bulk voltage and a threshold voltage distribution according to a main erase algorithm of the present invention.
Figure 9:
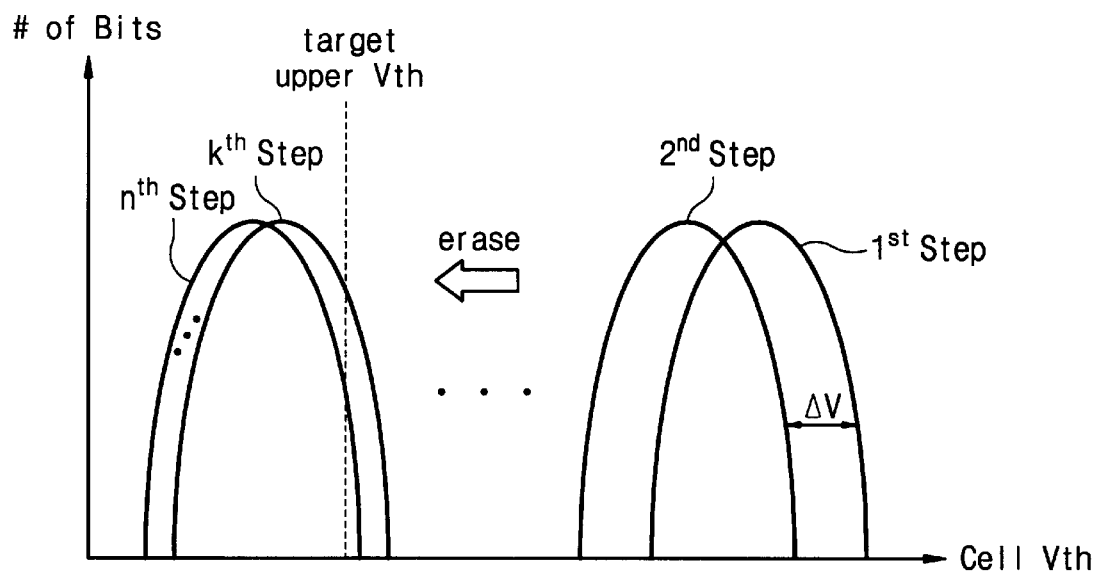

According to the present invention, as illustrated in FIG. 9A, a bulk stepping scheme for accelerating erase speed is utilized during the first erase discrimination period while the bulk stepping scheme is not utilized during the second erase discrimination period. In the former case, a threshold voltage of a memory cell is shifted lower (left on the X-axis) in proportion to an increased magnitude of the bulk voltage. In the latter case, the threshold voltage of the memory cell is more finely shifted lower in voltage (left on the X-axis) according to the shorter lapse of time. As a result, since the NGBE operation is carried out using a fixed bulk voltage, the threshold voltages of memory cells having bad erase properties or slow erase speeds are finely shifted down depending on a decreasing lapse of time instead of increasing bulk voltage. This means that the number of over-erased memory cells caused by the bad erase property is reduced. Thus, a total erase time can be reduced and device performance and reliability improved.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for erasing an array of memory cells arranged in rows and columns comprising the steps of:
   executing an erase operation for simultaneously erasing the memory cells of the array in accordance with a predetermined bulk voltage; and
   executing an erase verify operation for verifying whether the erased memory cells comply with a predetermined target threshold voltage distribution,
   wherein the erase and erase verify operations are repeated in a predetermined number of maximum erase loops;
   wherein each successive erase operation is executed using a gradually increased bulk voltage until the number of cells having a fail bit determined by the erase verify operation reaches a first low threshold value and thereafter the erase operation is executed using a fixed bulk voltage until the number of cells having a fail bit determined by the erase verify operation reaches a second value.

2. A method for erasing an array of memory cells arranged in rows and columns through a set of erase and erase verify operations comprising:
   a first step of performing the erase operation according to a controlledly increasing bulk voltage during a first erase discrimination period in which a fail number of the erase verify operation is higher than a predetermined first value; and
   a second step of performing the erase operation according to a fixed bulk voltage during a second erase discrimination period in which the fail number of the erase verify operation is between the first predetermined value and a predetermined second value.

3. The erase method according to claim 2, wherein the first step comprises the steps of:
   repeatedly performing erase verify operation to ones of the memory cells after simultaneously erasing the memory cells according to a predetermined bulk voltage;
   generating a pass/fail signal for each of the memory cells indicating that the erase verify operation has failed; and
   increasing the bulk voltage when the generated number of the pass/fail signals is higher than the predetermined first value and performing another erase operation to the array according to the increased bulk voltage.

4. The method according to claim 2, wherein the second steps comprises the steps of:
   repeatedly performing the erase verify operation to ones of the memory cells after simultaneously erasing the memory cells according to the fixed bulk voltage;
   generating a pass/fail signal for each of the memory cells indicating that the erase verify operation has failed; and
   performing the erase operation to the array according to the fixed bulk voltage when the generated number of the pass/fail signals is higher than the second predetermined value.

5. The method according to claim 2, wherein the second predetermined value is less than the first predetermined value and is zero or greater than zero.

6. The method according to claim 2, wherein the fixed bulk voltage of the second step is the same bulk voltage used in the last erase operation performed in the first step.

7. A flash memory device comprising:
   an array of memory cells arranged in rows and columns;
   a row selection circuit for selecting one or more of the rows in response to a row address;
   a column selection circuit for selecting one or more of the columns in response to a column address;
   a sense amplifier circuit for sensing and amplifying data bits stored in memory cells arranged at intersections of the selection row and columns;
   a high voltage generating circuit for generating a bulk voltage to be applied to a bulk in which the memory cells are formed during an erase operation; and
   an erase control circuit for receiving the data bits from the sense amplifier circuit to effect erasing of selected ones of the memory cells,
   wherein the erase control circuit determines whether threshold voltages of the selected and nominally erased ones of the memory cells are distributed in a predefined target threshold voltage range corresponding to an erased state and generates one or more pass/fail signals indicating for which number if any of the selected and nominally erased ones of the memory cells the erase verify operation has failed;

wherein if the generated number of pass/fail signals is larger than a first predetermined value, then the erase control circuit controls the high voltage generating circuit such that the bulk voltage is stepped to controlledly increase it; and wherein if the generated number of the pass/fail signals is between the first predetermined value and a second predetermined value, the erase control circuit controls the high voltage generating circuit such that the bulk voltage is maintained substantially constantly.

8. The flash memory device according to claim 7, wherein the second predetermined value is less than the first predetermined value and is zero or a positive integer.

9. A flash memory device comprising:

an array of memory cells arranged in rows and columns;

a row selection circuit for selecting one or more of the rows in response to a row address;

a column selection circuit for selecting one or more of the columns in response to a column address;

a sense amplifier circuit for sensing and amplifying data bits stored in memory cells arranged at intersections of the selection row and columns;

a high voltage generating circuit for generating a bulk voltage to be applied to a bulk in which the memory cells are formed during an erase operation; and an erase control circuit for receiving the data bits from the sense amplifier circuit to effect erasing of selected ones of the memory cells, wherein the erase control circuit includes a fail bit counter and a first and a second comparator, the erase control circuit determining whether threshold voltages of the selected and nominally erased ones of the memory cells are distributed in a predefined target threshold voltage range corresponding to an erased state and generates one or more pass/fail signals indicating for which number, as stored in the fail bit counter, if any of the selected and nominally erased ones of the memory cells the erase verify operation has failed;

wherein if the generated number of pass/fail signals is larger than a first predetermined value, as determined by the first comparator, then the erase control circuit controls the high voltage generating circuit such that the bulk voltage is stepped to controlledly increase it; and wherein if the generated number of the pass/fail signals is between the first predetermined value and a second predetermined value, as determined by the second comparator, the erase control circuit controls the high voltage generating circuit such that the bulk voltage is maintained substantially constantly.

* * * * *

UNITED STATES PATENT AND TRADEMARK OFFICE
CERTIFICATE OF CORRECTION

PATENT NO.    : 6,529,413 B2
DATED         : March 4, 2003
INVENTOR(S)   : Lee et al.

It is certified that error appears in the above-identified patent and that said Letters Patent is hereby corrected as shown below:

Column 1,
Line 49, "14.5 V" should read -- 4.5 V --.

Column 3,
Line 44, "(e.g., 0.2 V~03. V)" should read -- (e.g., 0.2 V~0.3 V) --.

Column 7,
Line 20, "next step S100," should read -- next step S110, --.

Signed and Sealed this

Twenty-seventh Day of July, 2004

JON W. DUDAS
*Acting Director of the United States Patent and Trademark Office*